US009681527B2

(12) United States Patent
Foltz et al.

(10) Patent No.: US 9,681,527 B2
(45) Date of Patent: Jun. 13, 2017

(54) METHOD AND APPARATUS FOR PROVIDING A CURRENT RETURN NETWORK IN AN AIRCRAFT STRUCTURE

(71) Applicant: The Boeing Company, Chicago, IL (US)

(72) Inventors: Gregory Alan Foltz, Seattle, WA (US); Kirk B. Kajita, Newcastle, WA (US); Paul S. Gregg, Seattle, WA (US); Arthur C. Day, Seattle, WA (US); Marc J. Piehl, Renton, WA (US)

(73) Assignee: The Boeing Company, Chicago, IL (US)

( * ) Notice: Subject to any disclaimer, the term of this patent is extended or adjusted under 35 U.S.C. 154(b) by 674 days.

(21) Appl. No.: 13/853,162

(22) Filed: Mar. 29, 2013

(65) Prior Publication Data
US 2014/0293497 A1 Oct. 2, 2014

(51) Int. Cl.
*H05F 3/00* (2006.01)
*B64C 1/12* (2006.01)
(Continued)

(52) U.S. Cl.
CPC ............... *H05F 3/00* (2013.01); *B64C 1/12* (2013.01); *B64D 45/02* (2013.01); *H05K 13/00* (2013.01); *Y10T 29/49117* (2015.01)

(58) Field of Classification Search
USPC .......................................................... 361/218
See application file for complete search history.

(56) References Cited

U.S. PATENT DOCUMENTS 3,906,308 A 9/1975 Amason et al.
4,304,376 A * 12/1981 Hilton ...................... B64C 3/20
244/117 R
(Continued)

FOREIGN PATENT DOCUMENTS

CN 101146710 3/2008
EP 1186398 A1 3/2002
(Continued)

OTHER PUBLICATIONS

European Search Report Application No. EP14162814 dated Jun. 18, 2014.
(Continued)

*Primary Examiner* — Ronald W Leja
(74) *Attorney, Agent, or Firm* — Kunzler Law Group, PC

(57) ABSTRACT

According to an embodiment a current return network assembly, for an aircraft having a predetermined potential lightning strike zone, is mounted within the predetermined potential lightning strike zone. The current return network assembly includes an electrically conductive honeycomb central core that conducts electrical current both through the assembly and through the predetermined potential lightning strike zone. The electrical current is caused by a lightning strike on the aircraft at the predetermined potential lightning strike zone. According to an embodiment, an aircraft has a predetermined potential lightning strike zone. A current return network assembly is within the zone. An electrically conductive honeycomb central core is provided for conducting electrical current through the assembly and through the zone wherein the electrical current has been caused by a lightning strike on the aircraft at the zone.

21 Claims, 5 Drawing Sheets

(51) Int. Cl.
*B64D 45/02* (2006.01)
*H05K 13/00* (2006.01)

(56) References Cited

U.S. PATENT DOCUMENTS

| | | | |
|---|---|---|---|
| 4,623,951 A | 11/1986 | Dupont et al. | |
| 4,667,905 A * | 5/1987 | Hamm | B64C 3/18 244/123.13 |
| 5,417,385 A | 5/1995 | Arnold et al. | |
| 6,175,336 B1 * | 1/2001 | Coughlin | H01Q 1/28 343/705 |
| 7,866,609 B2 | 1/2011 | Parikh | |
| 2004/0069895 A1 | 4/2004 | Pham et al. | |
| 2008/0217478 A1 * | 9/2008 | Keeler | B64C 1/18 244/119 |
| 2010/0103582 A1 | 4/2010 | Shimp et al. | |
| 2010/0264268 A1 * | 10/2010 | Schneider | B64D 11/003 244/118.5 |
| 2011/0084174 A1 * | 4/2011 | Hemmelgarn | B64C 3/48 244/200 |
| 2011/0232850 A1 | 9/2011 | Hartwell et al. | |
| 2013/0271891 A1 * | 10/2013 | Shimp | H02H 1/04 361/220 |
| 2013/0320142 A1 * | 12/2013 | Nordman | B64C 3/20 244/123.5 |
| 2014/0293497 A1 * | 10/2014 | Foltz | H05F 3/00 361/218 |

FOREIGN PATENT DOCUMENTS

| | | |
|---|---|---|
| FR | 2924685 A1 | 6/2009 |
| WO | 2006102090 A1 | 9/2006 |
| WO | 2009112259 A1 | 9/2009 |

OTHER PUBLICATIONS

Office Action for Canadian Application No. 2,840,624 dated Nov. 18, 2015.
Chinese Office Action and Search Report with translation for Chinese Patent Application No. 201410123024.6 dated Feb. 4, 2017.

* cited by examiner

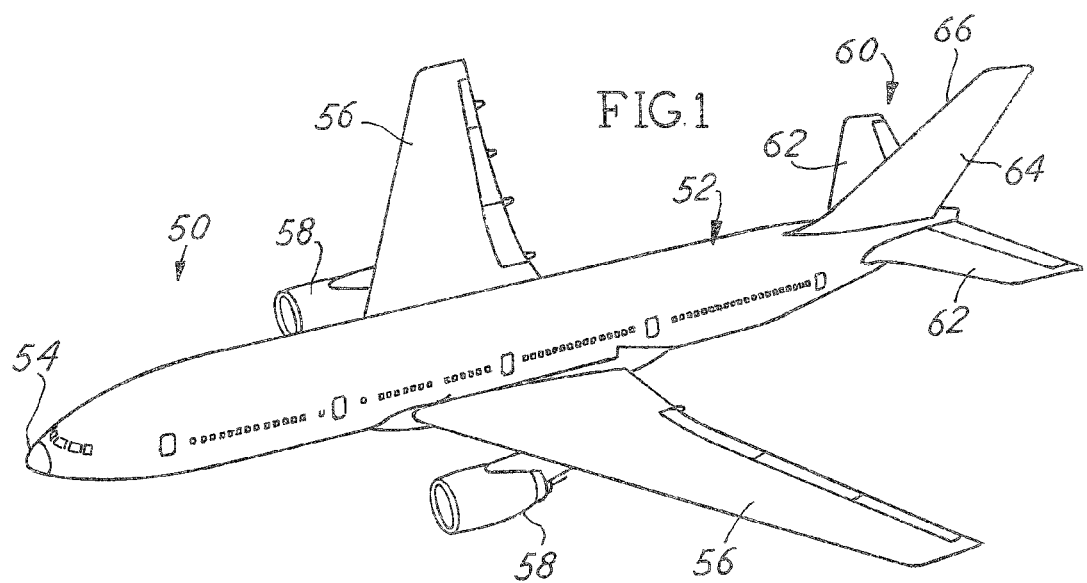
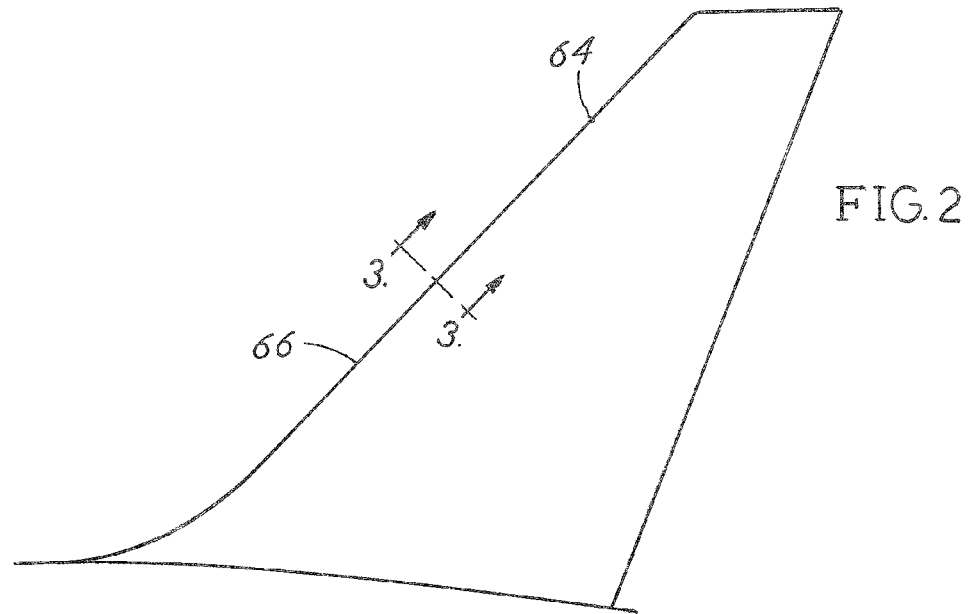

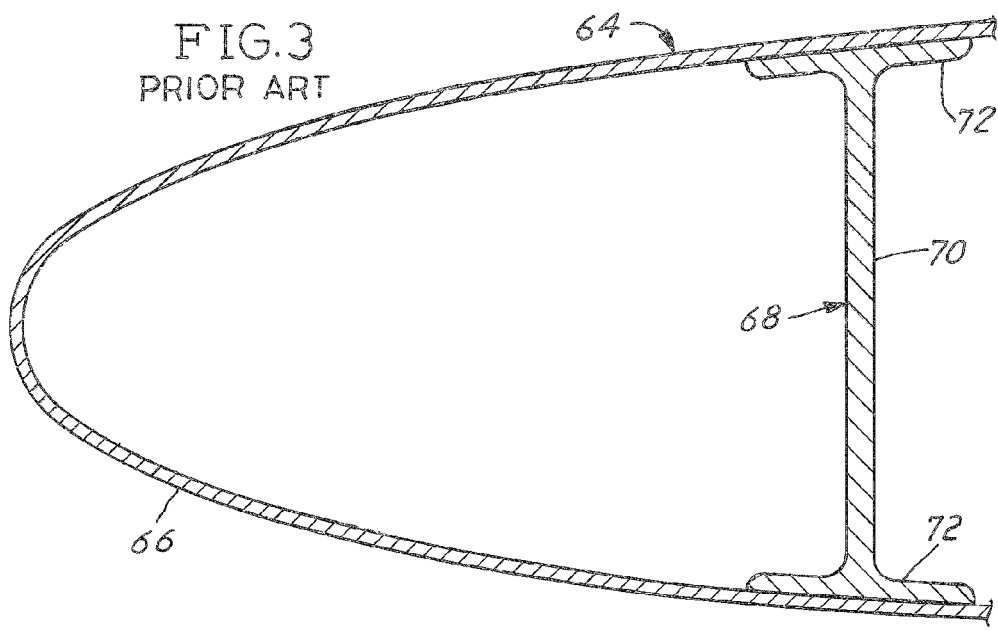
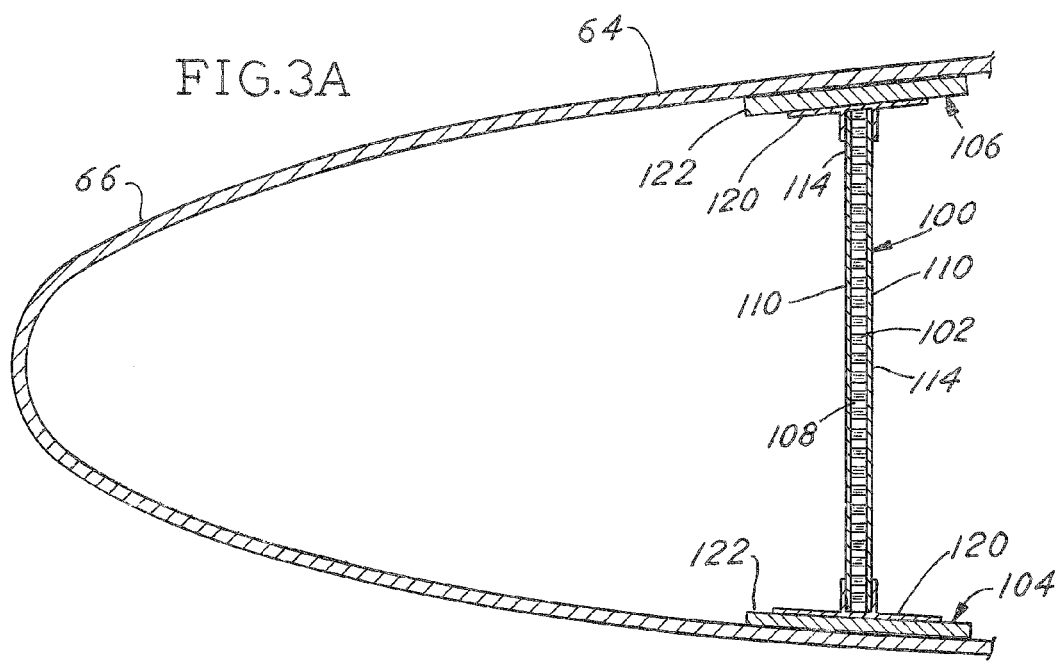

METHOD AND APPARATUS FOR PROVIDING A CURRENT RETURN NETWORK IN AN AIRCRAFT STRUCTURE

REFERENCE

[Not Applicable]

FEDERALLY SPONSORED RESEARCH OR DEVELOPMENT

[Not Applicable]

MICROFICHE/COPYRIGHT REFERENCE

[Not Applicable]

FIELD

Certain aspects of the disclosure relate generally to a current return network in an aircraft. More specifically, certain embodiments of the disclosure relate to a method and assembly wherein the current return network functions as both a current return network (CRN) and also as a load-bearing support for at least a portion of the aircraft.

BACKGROUND

Possibly, the greatest variable in air travel is weather. Weather conditions may have many elements, including winds, temperatures, lightning, thunder, icing conditions, rain, snow, turbulence caused by weather fronts, fog, smog, tornadoes, and hurricanes. Weather conditions are important, not only to the passengers but also to airlines, air traffic control personnel, weathermen, pilots and crew.

Lightning is one specific weather element that may occur during air travel. It has been reported that, on average, an aircraft is struck by lightning only about once in a given year. Historically, commercial aircraft have generally included aluminum skin which is electrically conductive. In the event that there is a lightning strike on an aluminum skinned aircraft, the strike commonly enters at an extremity of the aircraft, such as at the nose or other zone. The electrical energy or current carried by the strike typically passes through the aluminum electrically conductive skin of the aircraft and then exits the aircraft at another extremity, such as at the tail. No harm typically occurs to the passengers or to any of the equipment on board.

In the case of modern aircraft using at least some composite materials such as on the outer skin, additional measures are usually taken because such composite materials are not as electrically conductive when compared with an aluminum skin aircraft. One such measure includes a current return network assembly which may be provided at various locations on the partially composite aircraft. It is to be understood that the composite aircraft is not entirely composite and that there are areas of conductive material, such as aluminum, used on certain portions of the aircraft.

In the design of aircraft, the weight of various components is typically very important. The current return network assembly provided on aircraft is not usually a great concern, particularly in aluminum aircraft, which itself may comprise a large portion of such a current return network. However, with composite aircraft, it would be highly desirable to provide a current return network assembly that does not add weight to the aircraft because a reduction in the weight of an aircraft typically increases fuel efficiency.

Further limitations and disadvantages of conventional and traditional approaches will become apparent to one of skill in the art, through comparison of such approaches with the present disclosure as set forth in the remainder of the present application including the drawings.

BRIEF SUMMARY

According to an embodiment a current return network assembly, for an aircraft having a predetermined potential lightning strike zone, is mounted within the predetermined potential lightning strike zone. The current return network assembly includes an electrically conductive honeycomb central core that conducts electrical current both through the assembly and through the predetermined potential lightning strike zone. The electrical current is caused by a lightning strike on the aircraft at the predetermined potential lightning strike zone.

According to a further embodiment, an aircraft having a predetermined potential lightning strike zone has an inner portion. A current return network assembly is mounted at the zone and within the inner portion of the predetermined potential lightning strike zone. An electrically conductive honeycomb central core portion is provided as a component of the current return network assembly. The central core portion conducts electrical current through the honeycomb core and also through the zone. The electrical current that is conducted is caused by a lightning strike on the aircraft at the zone.

According to yet a further embodiment, a method is provided for constructing a current return network assembly used in aircraft. The method includes the steps of initially identifying a potential lightning strike zone on the aircraft wherein the zone is made of a material that it is at least partially of low electrical conductivity. The method includes the step of identifying a replaceable member in the zone that is capable of being usefully replaced by the current return network assembly. The next step involves determining at least one physical requirement of the replaceable member in the zone. The next step is providing the current return network assembly with an electrically conductive honeycomb central core that is capable of conducting electrical current through the core and through the zone when electrical current is caused by a lightning strike at the zone. The final step is constructing the assembly having the physical requirements of the replaceable member of the aircraft.

The features, functions, and advantages that have been discussed above can be achieved independently in various embodiments or may be combined in yet other embodiments, further details of which can be seen with reference to the following description and drawings.

BRIEF DESCRIPTION OF SEVERAL VIEWS OF THE DRAWINGS

FIG. 1 is an illustration of an aircraft having one or more zones within which the current return network assembly can be installed;

FIG. 2 is an illustration of a vertical stabilizer of the aircraft shown in FIG. 1 wherein the current return network assembly may be installed;

FIG. 3 is an enlarged cross sectional view taken along the lines 3-3 of FIG. 2 showing the leading edge of the prior art vertical stabilizer of FIG. 2 and wherein an auxiliary support spar is provided;

FIG. 3A is a view similar to FIG. 3 showing the use of the current return network assembly that replaces the spar illustrated in the prior art FIG. 3;

DETAILED DESCRIPTION

Figure 4:
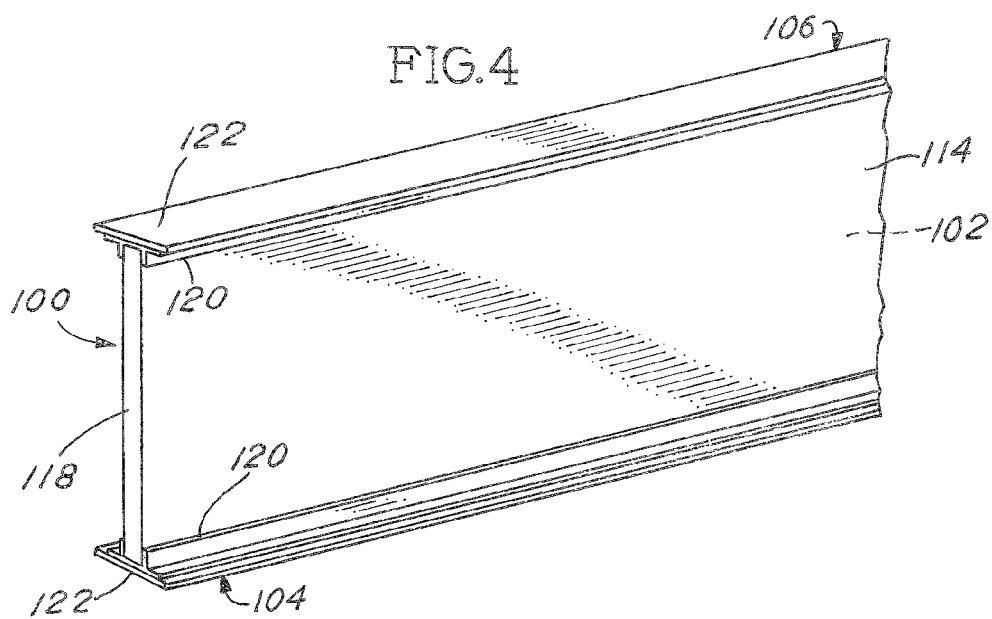
FIG. 4 is a perspective view of the return network assembly shown in FIG. 3A.

The following description and the accompanying drawings set out below provide details of the current return network assembly and method for making such an assembly. The description, as follows, is not to be considered in a limiting sense but it is provided for the purpose of illustrating the general principles of the claims relating to the described current network assembly and method for manufacture. The scope of the disclosure will be defined by the claims that follow the detailed description.

The description of the current return network assembly is primarily directed to use with commercial aircraft of the type that uses significant amounts of composite material including use on the fuselage, wings and tail section. However, it is to be understood that the current return network may also be used with aircraft primarily constructed of aluminum components as opposed to composite components.

Referring to FIG. 1, there is provided an illustration of an aircraft, generally 50. The aircraft 50, as discussed above, is primarily directed to an aircraft of modern design using significant amounts of composite materials such as carbon fiber reinforced plastic (CFRP) materials. As used herein, CFRP may refer equally to Carbon fiber reinforced polymer, carbon fiber reinforced plastic, carbon fiber reinforced thermoplastic, or carbon filled plastic to describe a strong and light weight fiber-reinforced polymer which contains or may be filled with carbon fibers. The aircraft 50 includes a central fuselage, generally 52, having a nose section 54 having a pair of laterally projecting wings 56 fixedly secured to opposite sides of the fuselage 52. Jet engines 58 are fixedly mounted on each of the wings 56. The aircraft 50 further includes a tail section, generally 60, which includes a pair of laterally projecting horizontal stabilizers 62 and a vertical stabilizer (sometimes referred to as a fin), generally 64, projecting upwardly from the central rear portion of the fuselage 52 of the aircraft 50 and is part of the tail section 60, that includes a leading edge portion 66.

Referring to FIG. 3, there is shown an enlarged cross-sectional view of the leading edge portion 66 of the vertical stabilizer 64. Specifically, FIG. 3 is a prior art section along the line 3-3 of FIG. 2 illustrating the leading edge portion 66 of the vertical stabilizer 64 that is partially broken. Positioned rearward of the leading edge portion 66 of the vertical stabilizer 64, there is provided an auxiliary aluminum spar, generally 68, of conventional design. The spar 68 has a solid unitary central web section 70 having laterally spaced unitary flanges 72. The spar 68 provides structural support generally for the leading edge portion 66 of the vertical stabilizer 64, as illustrated in FIGS. 1-3.

Certain zones of the aircraft 50 may have a higher incidence of a potential rare lightning strike on the aircraft 50 in a location that may have significant amounts of composite material used thereon, including on the fuselage 52, wings 56, and tail section 60. The following description relates to the use of the current return network assembly 100 used on the aircraft 50. As will be described in more detail, the current return network assembly 100 has a dual function in that the current return network assembly 100 provides a structural substitute or replacement for the aluminum spar 68 shown in FIG. 3 and further provides a current return network for any rare lightning strike that may occur at the vertical stabilizer 64.

Current Return Network Assembly

As described above, lightning strike zones on the aircraft 50 may include the outer tips of the wings 56, the horizontal stabilizers 64, the vertical stabilizer 62, and the nose 56. These are the zones of the aircraft 50 where a current return network assembly 100 of the present description may beneficially be installed. It is to be understood that there may be additional locations that may be selected other than identified above. Further, it is to be understood that the current return network assembly 100 is primarily expected to be used on aircraft containing composite materials such as on the skin of the aircraft, but use of the current return network assembly 100 is not intended to be limited to such uses.

Referring to FIG. 4, the current return network assembly 100 is illustrated and is used in one or more of the potential lightning strike zones. For purposes of illustration herein, the current return network assembly 100 will be described in connection with installation within the vertical stabilizer 64 schematically shown in FIG. 4. Further. It is to be understood that the particular size and shape of the current return network assembly 100 may vary from the description herein depending on the specific zone where the current return network assembly is used on the aircraft 50.

Referring to FIG. 3A and FIG. 4, the current return network assembly includes a central core section, generally 102, a left side support flange assembly, generally 104, and a right side support flange, generally 106. Referring to FIG. 3A, as illustrated, the flange 104 is angled inwardly from right to left, while the flange 106 is angled inwardly from right to left. The reason for the angling of the flange 104 and flange 106 is that the flanges 104 and 106 are be used as support members to replace the aluminum spar 68 which has inwardly angled flanges 72 as illustrated in the prior art FIG. 3. This aspect will be described herein in greater detail.

Figure 7:
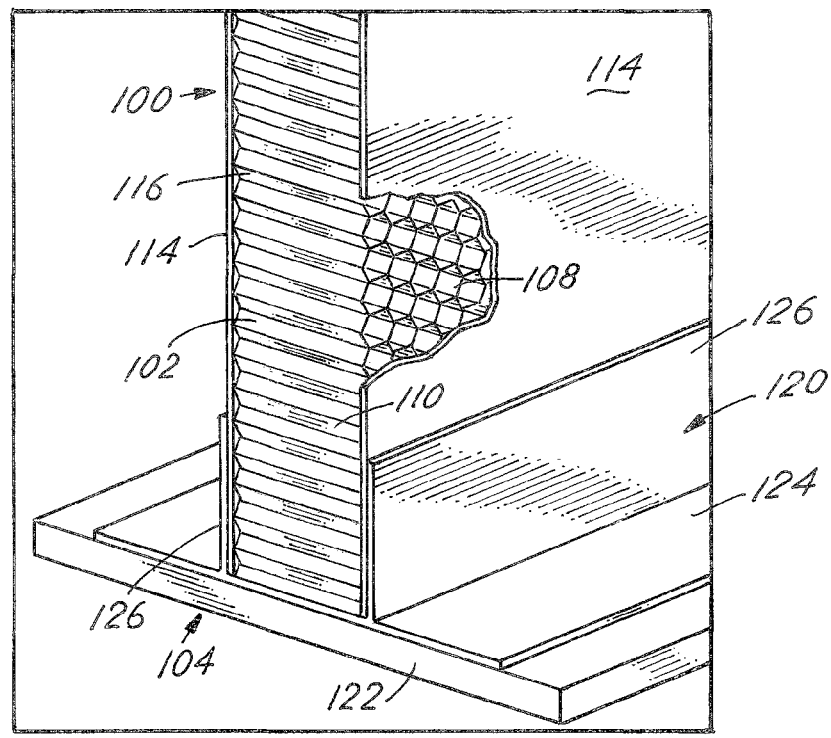
FIG. 7 is an illustration showing a lower end portion of the current return network assembly of FIGS. 3A and 4-6 and specifically illustrates a partial cross sectional view of the honeycomb core thereof.
Figure 8:
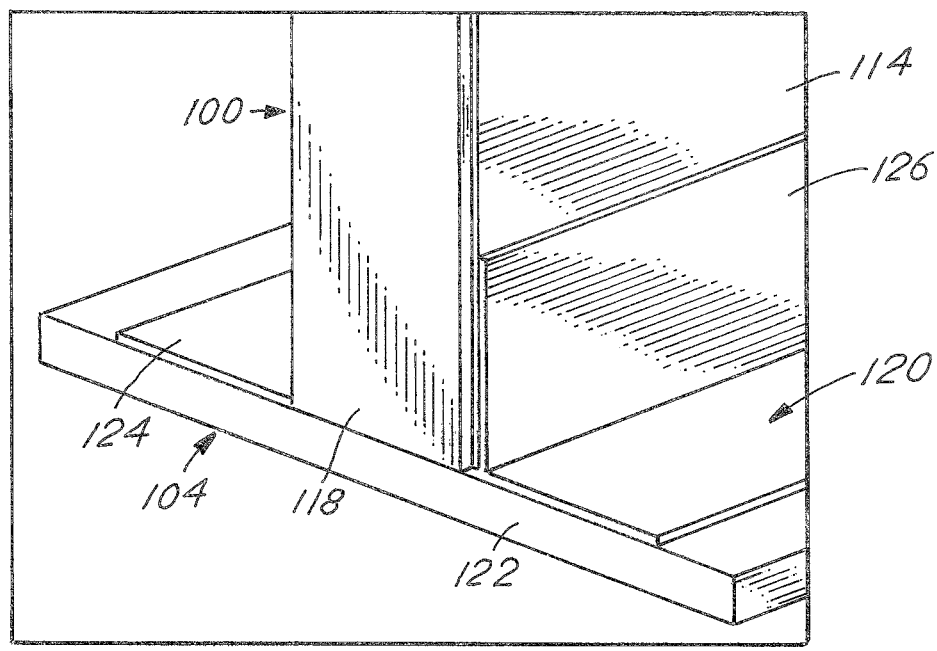
FIG. 8 is an illustration showing a pi-joint and an end cap at one end of the assembly of FIGS. 3A and 4-7.
Figure 9:
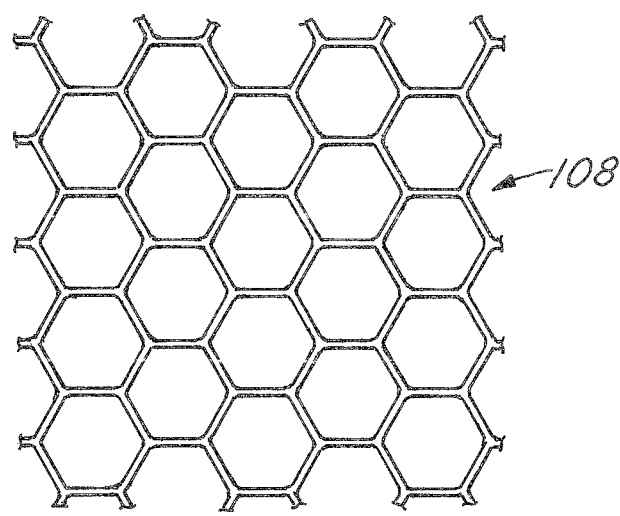
FIG. 9 is detailed view of a portion of the honeycomb core of the assembly of FIGS. 3A and 4-8.

The central core 102, as shown in FIGS. 5-8 and in particular in FIG. 7, comprises a central honeycomb core section 108 which is comprised of hollow hexagonal interconnected structural unitary tubes illustrated best in FIG. 7 and FIG. 9. The honeycomb core section 108 is transversely positioned relative to the laterally opposed sides 110 that perform a load-bearing structure for the central core assembly 102. The sides 110 of the honeycomb section 108 are enclosed by a pair of outer supporting sheets 114 which cover the sides 110 and provide added structural support for the honeycomb core 108. The ends 116 of the honeycomb core 108 are also covered by end caps 118 as seen best in FIG. 8. The end caps 118 are removed for illustration purposes in FIG. 7. FIG. 7 does, however, show the supporting side sheets 114 enclosing the ends 116 of the honeycomb structure 108. The honeycomb core section 108, the side sheets 114, and the end caps 118 cooperate to provide a structurally sound central core section that is sized and shaped to be used not only as a current return network (CRN) but also as a load-bearing support that replaces the aluminum spar 68 illustrated in FIG. 3.

Figure 5:
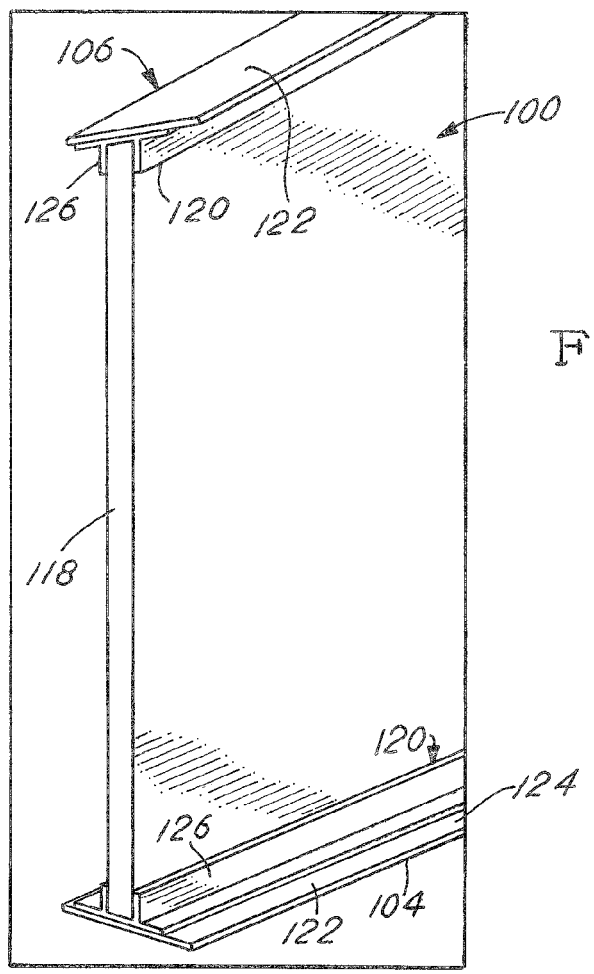
FIG. 5 is an enlarged view illustrating a portion of the current return network of FIG. 4.
Figure 6:
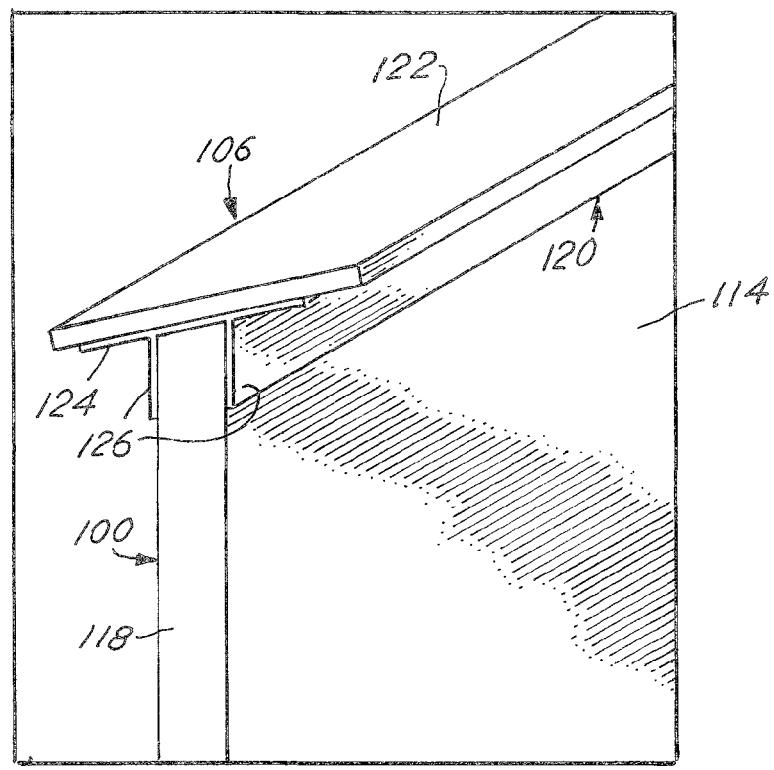
FIG. 6 is further enlarged view of an upper end portion of the current return network assembly shown in FIG. 5.

Referring to FIGS. 4, 5 and 8, the upper flange 104 and the lower flange 106 are constructed in substantially the same manner. Referring to FIG. 8, the lower flange 106 is schematically shown and includes a pi-joint member 120 and a composite plank member 122. The plank member 122 is securely mounted below and against the pi-joint member 120 and is bonded thereto. It is to be understood that the upper flange 104 has a similar pi-joint member 120 and plank member 122 bonded to the pi-joint member 120.

Each pi-joint member 120 comprises a plate portion 124 and a pair of upright laterally spaced portions 126 which define a central space there between for securely receiving and supporting the upper and lower ends of the central core section 102 by the upper flange assembly 104 and by the lower flange assembly 106, respectively. The upright portions 126 are unitarily formed with the plate portion 124.

Since the current return network assembly 100 provides for the passage of electrical current generated by a lightning strike in the area of the vertical stabilizer 64, the central core section 102 is constructed of an electrically conducting material. Preferably, the central honeycomb core 108 is constructed of aluminum. Titanium may also be used although it does not have as high an electrical conductivity. The side sheets 114 of the current return network assembly are preferably made of titanium or made of a carbon fiber reinforced plastic (CFRP) material both of which have a relatively low electrical conductivity. Preferably, the pi-joint members 120 used at the upper flange 104 and lower flange 106 are constructed of a carbon fiber reinforced plastic material or of titanium. The plank members 122 that are bonded to the pi-joints 120 at both the upper flange 104 and lower flange 106 are preferably constructed of a carbon fiber reinforced plastic material. The plank members 122 are designed to bear against the opposed inner sides of the vertical stabilizer 64 as illustrated in FIG. 3A. The end caps 118 are preferably made of aluminum although copper may also be used. Both metals are electrically conductive but aluminum is preferred since aluminum is lighter in weight than copper.

In the case of a lightning strike in the area of the vertical stabilizer 64, the current return network assembly 100 will cause the electric current from the lightning strike to pass from the exterior of one side of the vertical stabilizer 64 through the honeycomb core and outwardly, such as through the opposite side of the current return network assembly 100 and through the wall of the vertical stabilizer 64.

Method of Constructing and Installing the Current Return Network Assembly

As has been described above, the current return network assembly 100 is preferably designed, constructed, and installed at a potential lightning strike zone on the aircraft 50. In the case of installing the current return network assembly 100 in the vertical stabilizer 64, the current return network assembly 100 is designed to replace the use of the aluminum spar 68 as shown in prior art FIG. 3. By replacing the aluminum auxiliary spar 68 with the current return network assembly 100, there is a saving in weight and a saving in expense since the current return network assembly 100 functions as a load-bearing support in replacing the aluminum spar 68 in the vertical stabilizer zone 64 and also functions as a current return network (CRN) for the aircraft 50.

The method for constructing the load-bearing current return network assembly 100 first requires the step of identifying a potential lightning strike zone on the aircraft 50. Once such a zone is identified, the next step is to identify an existing component of the aircraft 50 that may be replaced by the current return network assembly 100. As discussed above, a potential lightning strike zone includes the vertical stabilizer 64 of the aircraft 50, and the auxiliary spar 68 is identified as being an aircraft component capable of being usefully replaced by appropriately designing the current return network assembly 100.

Once the auxiliary spar 68 has been identified as being usefully replaced by a suitably designed current return network assembly 100, the design parameters for the current return network assembly 100 are based upon the previously established design parameters of the auxiliary spar 68. The design parameters for the current network assembly 100 extend over a wide range and include, but are not limited to, (1) the overall dimensions of the current return network assembly 100 required for properly fitting into the available space within the vertical stabilizer 64 and adjacent other structure within the vertical stabilizer, (2) the load-bearing requirements for supporting the vertical stabilizer 64, (3) the coefficient of thermal expansion required for the current return network 100 to become a replacement for the auxiliary spar 64, (4) corrosion resistance requirements for the current return network assembly 100, (5) damage tolerance during manufacture, installation and service of the current return network assembly 100, and possibly other design parameters. Once the design parameters have been determined, the current return network assembly 100 is designed and constructed with the identified design parameters so the current return network assembly 100 is acceptable for use as a replacement for the auxiliary spar 68. It is to be understood that the auxiliary spar 68 is only one replaceable member of the aircraft 50 that can be replaced by a properly designed current return network assembly 100 depending on the particular location on the aircraft 50 that is selected to have the current return network assembly 100 installed.

The current return network assembly 100 is constructed with the central core section 102 and honeycomb core 108 with the supporting side sheets 114 and end caps 118. Finally, the top and bottom of the central core section 102 are installed on the previously joined pi-joints 120 and plank members 122 that define the upper and lower flanges 104 and 106. The current return network assembly 100 is then ready for installation and is installed in a location of the aircraft 50 as a replacement for the auxiliary spar 68 for which the current return network assembly 100 has been designed and constructed, that is, within the vertical stabilizer 64 as a replacement for the aluminum spar 68 as shown in FIG. 3.

While the disclosure has been described with reference to certain embodiments, it will be understood by those skilled in the art that various changes may be made and equivalents may be substituted without departing from the spirit and scope of the present disclosure. In addition, many modifications may be made to adapt a particular situation or material to the teachings of the present disclosure without departing from its scope. Therefore, it is intended that the present disclosure is not be limited to the particular embodiments disclosed, but that the present disclosure will include all embodiments falling within the scope of the appended claims.

What is claimed is:

1. In an aircraft having a predetermined potential lightning strike zone and having a current return network assembly for mounting within the zone, the assembly comprising:
a spar spanning an interior space of the aircraft, the spar comprising a weight-bearing central web spanning between a first flange assembly and second flange assembly attached to the interior of the aircraft, wherein the weight-bearing central web provides support for at least a portion of the aircraft, and wherein the central web comprises two laterally opposed sides and an electrically conductive honeycomb central core transversely positioned between the laterally opposed sides for conducting electrical current through the assembly, and the zone, the electrical current having been caused by a lightning strike on the aircraft at the zone,
wherein the spar further comprises:
outer supporting sheets that cover the two laterally opposed sides of the central web, and
electrically conductive end cap members mounted on opposing ends of the central web to cooperate with the central web in conducting the electrical current through the assembly, and
wherein the first flange assembly and the second flange assembly each comprises:
a pi-joint member comprising unitary upright portions that bound the two laterally opposed sides of the central web and the outer supporting sheets of the spar, and
a plank member attached to the interior of the aircraft, wherein the pi-joint member is bonded to the plank member.

2. The current return network assembly of claim 1 wherein the honeycomb central core is constructed of aluminum.

3. The current return network assembly of claim 1, wherein the central web is constructed to provide weight-bearing support between the first flange assembly and the second flange assembly.

4. The current return network assembly of claim 3 wherein the central web further comprises spaced ends and wherein the laterally opposed sides are interconnected by the ends, wherein the sides, the ends, and the honeycomb central core cooperate to at least partially provide the weight-bearing support.

5. The current return network assembly of claim 4, wherein the first and second flange assembly each comprises electrically conductive end cap members mounted on the ends of the central web to cooperate with the central web in conducting the electrical current through the assembly, the end cap members at least partially providing additional of the weight-bearing support.

6. The current return network of claim 5 including side sheets which are partially electrically conductive and are bonded to the laterally opposed sides of the central core, and wherein the side sheets, the end caps members, and the central core cooperate to provide the weight-bearing support and to cooperate in conducting the electrical current through the assembly and the zone.

7. The current return network assembly of claim 1 wherein the aircraft is at least partially constructed of a composite material in the zone.

8. The current return network assembly of claim 7 wherein the zone comprises a vertical stabilizer of the aircraft.

9. In an aircraft, the aircraft comprising:
a pre-determined potential lightning strike zone having an inner portion;
a current return network assembly mounted at the zone within the inner portion; and
a spar attached to an interior of the aircraft and spanning an interior space of the aircraft, the spar comprising a weight-bearing central web spanning between a first flange assembly and second flange assembly, wherein the weight-bearing central web provides support for at least a portion of the aircraft, and wherein the central web comprises two laterally opposed sides and an electrically conductive honeycomb central core portion transversely positioned between the laterally opposed sides, the central web as a component of the current return network assembly for conducting electrical current through the central web and through the zone, the electrical current being caused by a lightning strike on the aircraft at the zone,
wherein the spar further comprises:
outer supporting sheets that cover the two laterally opposed sides of the central web, and
electrically conductive end cap members mounted on opposing ends of the central web to cooperate with the central web in conducting the electrical current through the assembly, and
wherein the first flange assembly and the second flange assembly each comprises:
a pi-joint member comprising unitary upright portions that bound the two laterally opposed sides of the central web and the outer supporting sheets of the spar, and
a plank member attached to the interior of the aircraft, wherein the pi-joint member is bonded to the plank member.

10. The aircraft of claim 9 wherein the zone is at least partially constructed of a composite material in the zone.

11. The aircraft of claim 9 wherein the zone comprises a vertical stabilizer of the aircraft.

12. The aircraft of claim 11 wherein the web comprises spaced ends, wherein the laterally opposed sides are interconnected by the ends, and wherein the ends, the sides, and the honeycomb core cooperate at least partially to provide the weight-bearing support for the vertical stabilizer.

13. The aircraft of claim 12 wherein the current return network includes a plurality of electrically conductive end caps mounted on the ends of the central web to cooperate with the honeycomb core in conducting the electrical current through the assembly and the current return network further including side sheets which are partially electrically conductive and are bonded to the side of the central web, and wherein the side sheets, the end caps, and the central web cooperate in conducting the electrical current through the assembly.

14. The aircraft of claim 9 wherein the assembly is constructed to provide structural weight-bearing support for the potential lightning strike zone of the aircraft.

15. A method for constructing a current return network assembly for use in an aircraft, the method comprising the steps of:
identifying a potential lightning strike zone on the aircraft, the zone being made of a material at least partially of low electrical conductivity;
identifying a replaceable member in the zone capable of being usefully replaced by the current return network assembly;
determining at least one design parameter of the replaceable member in the zone;

providing the current return network assembly comprising a spar spanning an interior space of the aircraft, the spar comprising a weight-bearing central web spanning between a first flange assembly and second flange assembly attached to the interior of the aircraft, wherein the weight-bearing central web provides support for at least a portion of the aircraft, and wherein the central web comprises two laterally opposed sides and an electrically conductive honeycomb central core transversely positioned between the laterally opposed sides, the central web capable of conducting electrical current through the core and through the zone wherein the electrical current is caused by the lightning strike;

constructing the assembly having the at least one design parameter of the replaceable member;

wherein the spar further comprises:
   outer supporting sheets that cover the two laterally opposed sides of the central web, and
   electrically conductive end cap members mounted on opposing ends of the central web to cooperate with the central web in conducting the electrical current through the assembly, and wherein the first flange assembly and the second flange assembly each comprises:
   a pi-joint member comprising unitary upright portions that bound the two laterally opposed sides of the central web and the outer supporting sheets of the spar, and
   a plank member attached to the interior of the aircraft, wherein the pi-joint member is bonded to the plank member.

16. The method of claim 15 wherein the step of determining the at least one design parameter includes determining a plurality of dimensions of the replaceable member and the constructing step includes constructing the current network assembly with the dimensions.

17. The method of claim 15 wherein the determining step includes determining multiple design parameters of the replaceable member and the method includes the step of installing the current return network assembly in the aircraft zone in a location originally designed for the replaceable member, the current return network assembly having the replaceable member design parameters in the zone and having the current return network capability in the event there is a future lightning strike at the zone, and the central web conducting electrical current from the lightning strike zone through both the zone and through the honeycomb core in the event there is a future lightning strike at the zone.

18. The method of claim 15 wherein the potential lightning strike zone of the aircraft is a vertical stabilizer.

19. The method of claim 15 wherein the replaceable member in the zone is a weight-bearing member.

20. The method of claim 15 wherein the step of determining the at least one design parameter includes determining weight-bearing requirements of the replaceable member and the constructing step includes constructing the current return network assembly to include the weight-bearing requirements of the replaceable member.

21. The method of claim 20 wherein the step of determining the at least one design parameter includes the further step of determining a plurality of dimensions of the replaceable member, and the constructing step includes constructing the current return network assembly with the dimensions of the replaceable member.

* * * * *